US006809501B2

(12) United States Patent
Kapsokavathis et al.

(10) Patent No.: US 6,809,501 B2
(45) Date of Patent: Oct. 26, 2004

(54) METHOD OF IMPROVING FUEL ECONOMY

(75) Inventors: Nick S. Kapsokavathis, Shelby Township, MI (US); Yaang Zhao, Shelby Township, MI (US); David W. Walters, Sterling Heights, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/386,256

(22) Filed: Mar. 11, 2003

(65) Prior Publication Data

US 2004/0189254 A1 Sep. 30, 2004

(51) Int. Cl.⁷ .............................................. H01M 10/44
(52) U.S. Cl. ....................................................... 320/132
(58) Field of Search ................................. 320/131, 132, 320/149, 104

(56) References Cited

U.S. PATENT DOCUMENTS 5,929,609 A * 7/1999 Joy et al. ....................... 322/25
6,336,063 B1 * 1/2002 Lennevi .......................... 701/22
6,404,163 B1 * 6/2002 Kapsokavathis et al. ..... 320/104

* cited by examiner

*Primary Examiner*—Edward H. Tso
(74) *Attorney, Agent, or Firm*—Christopher DeVries

(57) ABSTRACT

A fuel economy control method includes estimating a temperature of a battery, measuring a current of the battery, and measuring a voltage of the battery. A nominal optimum charging voltage is determined as a function of a state of charge (SOC) of the battery and the estimated temperature. The nominal optimum charging voltage is reduced to a fuel economy minimum charging voltage if the SOC is above a predetermined level and the current is within a predetermined range.

37 Claims, 9 Drawing Sheets

METHOD OF IMPROVING FUEL ECONOMY

FIELD OF THE INVENTION

The present invention relates to vehicle battery recharging, and more particularly to a vehicle battery recharging method and apparatus for improving battery life, headlamp life, and fuel economy.

BACKGROUND OF THE INVENTION

A vehicle battery is an electrochemical device that includes one or more cells that convert chemical energy to electric energy. Currently, automobile batteries are "12-volt" direct-current (DC) batteries that supply approximately 12.6 volts. Conventional 12-volt batteries typically include six series-connected cells, which produce approximately 2.1 volts.

When a driver starts an engine of a vehicle, the starter draws current from the battery and reduces the charge on the battery. A charging system recharges the battery and typically includes an alternator (or generator), a voltage regulator, and an optional charge indicator. The generator is a direct current (DC) generator that converts mechanical movement of the engine into electrical power that charges the battery. The voltage regulator regulates output voltage and current levels produced by the generator. The charge indicator provides a visual indication of the operational health of the charging system and/or the battery.

Once the engine is running, the charging system charges the battery and powers other electrical systems and loads associated with the vehicle. Some of the electrical loads of the vehicle may include, for example, heating ventilation and air-conditioning (HVAC) blowers, an air-conditioning (AC) compressor clutch, heated seats, heated mirrors, a window defogger, window wipers, courtesy door lights, interior lights, engine cooling fans, etc.

The voltage regulator maintains the output voltage of the generator within a voltage range, such as 13 to 16 volts. When the voltage stays within the voltage range, the generator can perform several functions. The generator can charge the battery, and can supply power to the other vehicle electrical systems and loads. Problems associated with undercharging or overcharging of the battery are also prevented. If the battery is undercharged, the battery cannot crank and start the engine. If the battery is overcharged, the battery may overheat and/or experience "gassing" (the formation of acid fumes within the battery) and become permanently damaged.

The voltage regulator adjusts the output voltage of the generator based on the temperature of the battery and the state of charge (SOC) of the battery. However, conventional temperature and SOC monitors are expensive and not accurate. Conventional temperature and SOC monitors also require a significant amount of extra wiring and additional electronic components.

SUMMARY OF THE INVENTION

The present invention provides a fuel economy control method that measures current supplied by a battery. A state of charge (SOC) of the battery is determined. A nominal optimum charging voltage of the battery is determined. The nominal optimum charging voltage is reduced to a fuel economy minimum charging voltage if the SOC is above a predetermined level and the current is within a predetermined range.

In other features, the predetermined level is preferably 80%, and the predetermined range is between −8 A and 15 A. The step of reducing is performed if an outside air temperature is within a first temperature range, a vehicle speed is less than a predetermined speed, and an accessory is off.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
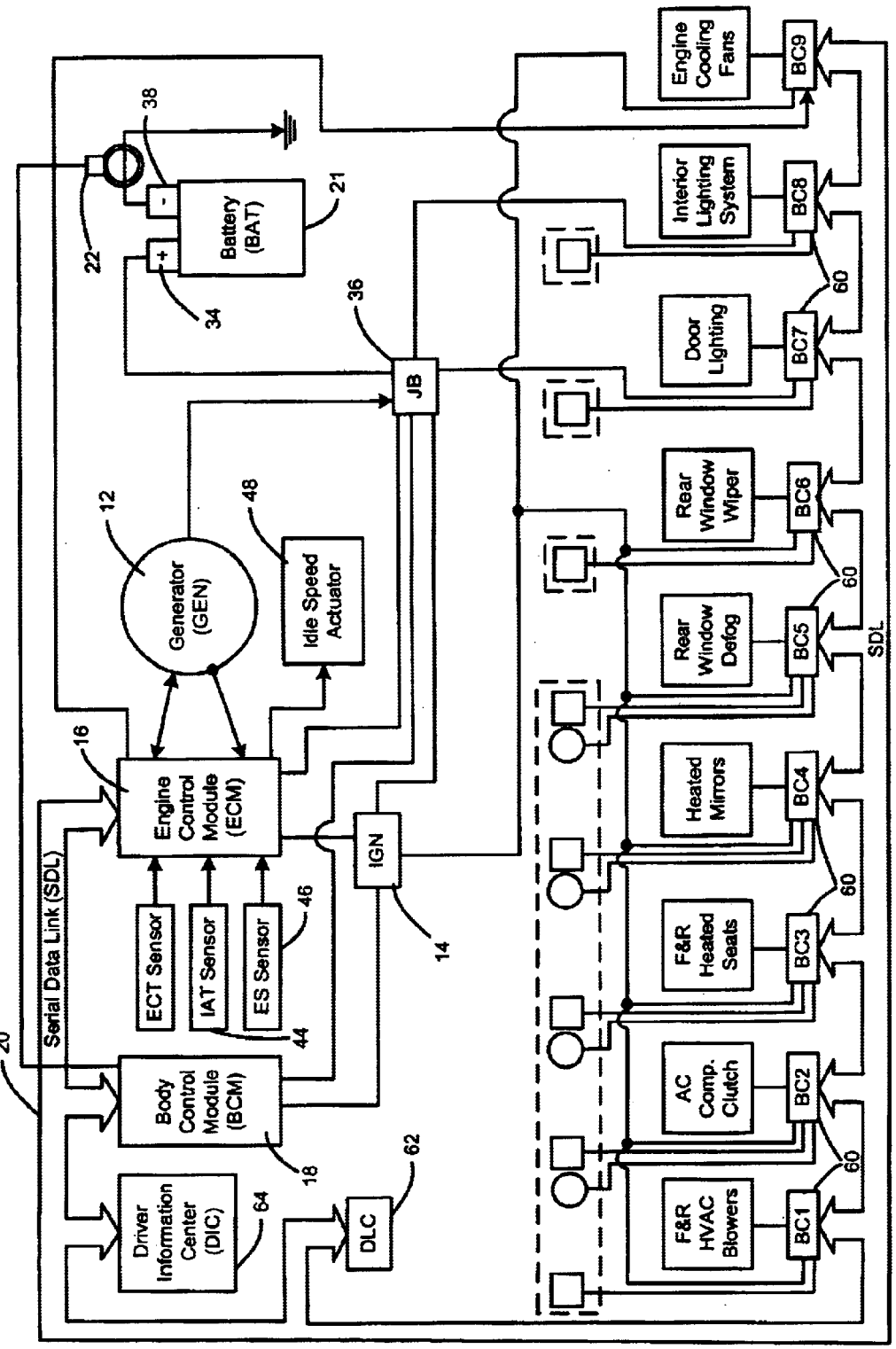
FIG. 1 is a functional block diagram of a system for regulating a charge voltage delivered to a battery according to the present invention.

The following description of the preferred embodiment is merely exemplary in nature and is in no way intended to limit the invention, its application, or uses. For purposes of clarity, the same reference numbers will be used in the drawings to identify similar elements.

In addition to maintaining the generator output voltage within a voltage range, a voltage regulator varies the generator output voltage within the voltage range to accommodate changes in operating conditions. In doing so, the voltage regulator conserves battery life and improves the fuel economy of the vehicle. Initially, the voltage regulator signals the generator to produce an output voltage near a high end of the voltage range when the engine is started. If the engine is on briefly, the battery is recharged before the engine is turned off.

When the battery is fully recharged while the engine is running, the voltage regulator reduces the generator output voltage near the low end of the voltage range. When operated properly, the voltage regulator prevents overcharging and gassing of the battery. The voltage regulator also preserves battery life and increases the life of vehicle components such as headlights.

If the automobile is idling in slow traffic with high electrical loads discharging the battery, the voltage regulator sets the generator output voltage near the upper end of the voltage range. Once the battery is recharged, the voltage regulator reduces the generator output voltage near the lower end of the voltage range.

To operate the voltage regulator as described above, a controller periodically polls battery temperature and "state of charge" (SOC). In one embodiment, the battery temperature is measured by sensing the temperature of an electrolyte solution within the battery. If the battery temperature is low, the battery requires a higher recharging voltage than is required for higher battery temperatures. The controller estimates the battery temperature and controls the voltage regulator to provide an appropriate generator output voltage.

The controller also determines the SOC of the battery. The controller commands the output voltage of the voltage regulator to recharge the battery to a proper SOC and/or operate the electrical systems without undercharging or overcharging the battery. If the SOC is high, the controller commands the output voltage of the voltage regulator to reduce the battery voltage and/or operate the electrical systems at a lower voltage without undercharging or overcharging the battery.

Figure 2:
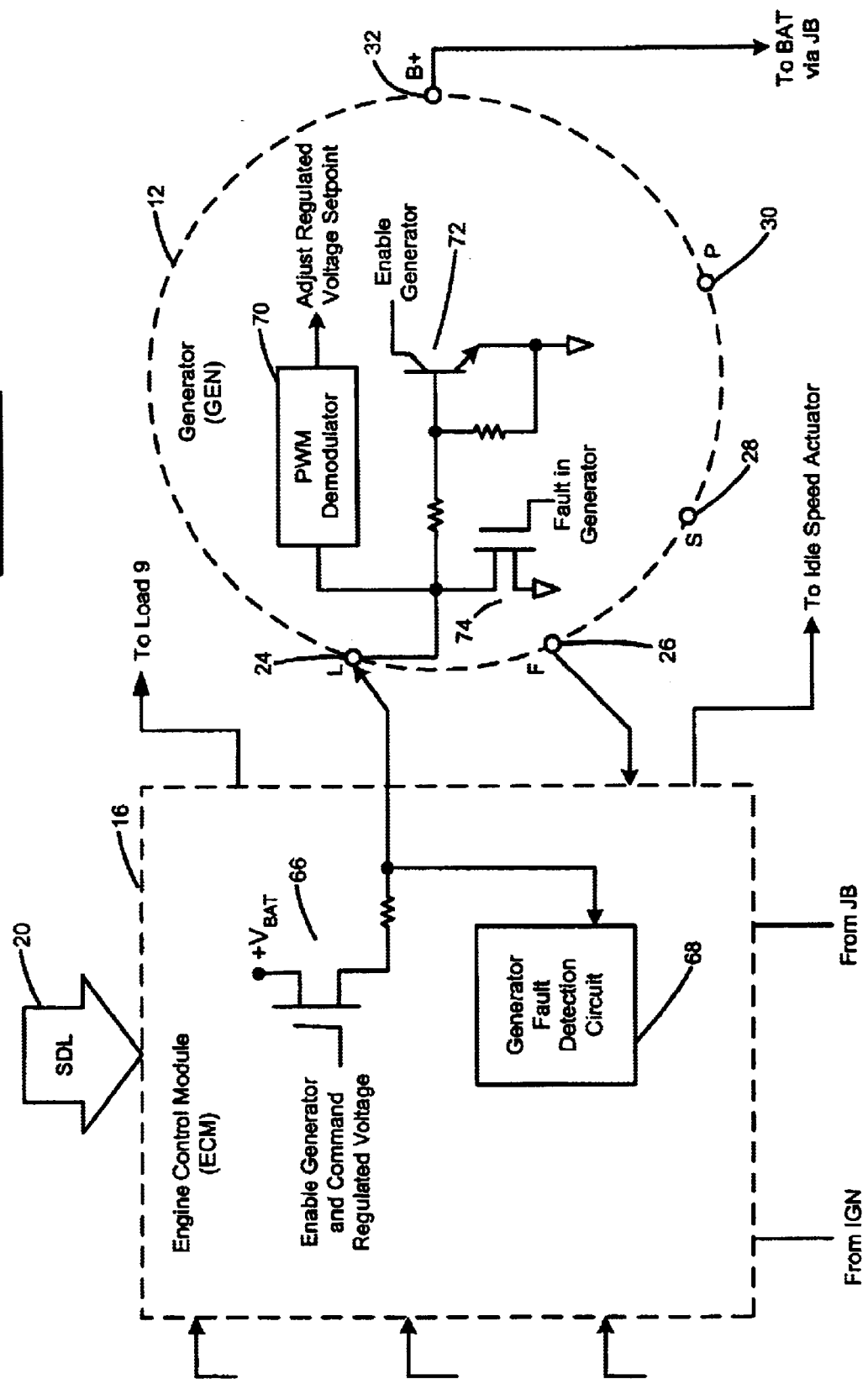
FIG. 2 is an electrical schematic showing an engine control module (ECM) and a generator for the system of FIG. 1.

Referring now to FIGS. 1 and 2, a system 10 regulates a charge voltage delivered to a battery in a vehicle with an engine. A similar system is described in commonly assigned U.S. Pat. No. 6,404,163, which is hereby incorporated by reference. The system 10 includes a generator (GEN) 12, an ignition (IGN) system 14, an engine control module (ECM) 16, a body control module (BCM) 18, a data link 20, a battery 21, and a current sensor 22. The generator 12 has an L-terminal 24, a "field" duty cycle monitor terminal (F-terminal) 26, a "sense" (S-terminal) 28, a P-terminal 30, and an output terminal (B+) 32. The ECM 16 provides a pulse width modulation (PWM) signal to the L-terminal 24, which varies a charge voltage thereof. The F-terminal 26 provides feedback to the ECM 16. The S-terminal 28 and the P-terminal 30 of the generator 12 are not required. The output terminal 32 of the generator 12 communicates with a positive terminal 34 of the battery 21 via a junction block (JB) 36. A negative terminal 38 of the battery 21 communicates with a chassis ground 40. The generator 12 delivers the optimum charge voltage to the battery 21 to recharge the battery 21.

The ignition system 14 is electrically connected through the JB 36 to the ECM 16 and the BCM 18. The ignition system 14 enables a driver to select "key-on" or "key-off" modes. When the ignition switch is in the "key-on" mode, the engine is turned on and electric signals are communicated from the ignition system 14 to the ECM 16 and the BCM 18. When the ignition switch is turned to the "key-off" mode, the engine is turned off and electric signals are generally no longer communicated.

The ECM 16 communicates with an engine coolant temperature (ECT) sensor 42, an intake air temperature (IAT) sensor 44, an engine speed (ES) sensor 46, an idle speed actuator 48, and the battery 21. The ECT sensor 42 provides coolant temperature signals to the ECM 16. The ECM 16 activates engine cooling fans if the coolant temperature exceeds a coolant threshold. The IAT sensor 44 measures the temperature of intake air, which is used to estimate the temperature of the battery 21. The IAT sensor 44 may include a temperature-sensitive thermistor located in the intake manifold of the engine. The ES sensor 46 measures engine revolutions per minute (rpm's). The ES sensor 46 may, for example, be located next to the crankshaft or camshaft.

The idle speed actuator 48 is used by the ECM 16 to either increase or decrease the idle speed of the engine. The idle speed actuator 48 may include, for example, an electric motor and gear mechanism that holds a throttle lever in a desired position. The ECM 16 is connected by the JB 36 to the battery 21 and the output terminal 32 of the generator 12. The ECM 16 is powered by the generator 12 or the battery 21 via the JB 36.

The BCM 18 is the primary processor that sends the command through the ECM 16 to the regulator that regulates a charge voltage delivered to the battery 21. The BCM 18 preferably includes read only memory (ROM), random access memory (RAM), electrically programmable ROM (EEPROM), flash memory, and/or any other suitable electronic storage. The BCM 18 periodically senses the voltage level and temperature of the battery 21 and estimates the state of charge (SOC) of the battery 21. The BCM 18 periodically senses the voltage level of the battery 21 when the system 10 is in the key-off mode. Both the ECM 16 and the BCM 18 communicate and share information via a serial data link (SDL).

The current sensor 22 can be a Hall-effect type current sensor that senses current in one of the battery leads. This type of current sensor provides a noise-immune signal and consumes very little power. The current sensor 22 may sense current in the negative lead of the battery 21. The current sensor 22 includes a magnetic core, or transducer, and a magnetic field measurement and signal conditioning device, or Hall-effect integrated circuit (HEIC). The transducer concentrates a magnetic field generated by the current running through the battery lead. A connector, or harness, is also included for connecting the current sensor 22 to the BCM 18. The connector includes a power supply lead, a ground lead and an output signal lead.

The transducer with the HEIC provides an electrical signal in response to magnetic flux (B) generated by the battery current ($I_p$). The HEIC converts the sensed magnetic flux (B) to a Hall voltage ($V_H$) via the following equation:

$$V_H = b \times I_p$$

where the value b is a pre-programmed constant. The Hall voltage ($V_H$) is amplified and sent as a PWM signal to the BCM 18 via the connector.

A plurality of body controllers (BCs) 60 are also connected to the SDL. The BCs 60 communicate with and control a plurality of vehicle electrical loads. In FIG. 1, the electrical loads include HVAC blowers, an AC compressor clutch, heated seats, heated mirrors, window defoggers (or defroster), window wipers, courtesy door lights, interior lights, engine cooling fans, and headlamps. The HVAC blowers, the AC compressor clutch, the heated seats, the heated mirrors, the window defogger, the window wipers, and the engine cooling fans are powered by the generator 12 or the battery 21 via the JB 36 and ignition system 14. These electrical loads generally operate only when the system 10 is in a key-on mode. In contrast, the headlamps, the door lights, and the interior lights operate in the key-on mode or the key-off mode.

A driver information center (DIC) 62 is also connected to the SDL 20. The DIC 62 is preferably a dash-mounted keyboard with a digital display and/or a speaker from which operational information and related data can be requested and obtained by a driver or passenger. The DIC 62 may also include malfunction indicator lights (MILs). Operational information and related data derived from multiple sensors is made available to an observing driver via the DIC 62.

Furthermore, in addition to the digital display, the speaker in the DIC 62 may also provide audible indicators that convey operational information to vehicle occupants.

Lastly, a data link connector (DLC) 64 communicates with the SDL 20. The DLC 64, sometimes referred to as a "diagnostic connector" or even an assembly line diagnostic link (ALDL), is a multi-pin connector that can be connected to a scan tool (or diagnostic readout tool) by a service technician to retrieve, via the SDL 20, diagnostic trouble codes stored In memory by the ECM 16 and/or the BCM 18.

Referring now to FIG. 2, electrical connections between the ECM 16 and the generator 12 are shown. The ECM 16 includes both an N-channel field-effect transistor (FET) 66 and a fault detection circuit 68. The drain of the FET 66 is connected to a voltage power source derived from the battery 21, which communicates with the ECM 16 via the JB 36. A source of the FET 66 is connected to the L-terminal 24 of the generator 12 via a resistor. The ECM 16 selectively biases the gate of the FET 66 to both enable the generator 12 and to generate electrical pulse width modulation (PWM) signals that communicate the charge voltage to the L-terminal 24 of the generator 12. The fault detection circuit 68 is connected to the L-terminal 24 of the generator 12. If the voltage level at the L-terminal drops below a predetermined value, the fault detection circuit alerts the ECM 16 that the generator 12 is malfunctioning or is in an inoperative state.

The generator 12 includes a PWM demodulator 70 that is connected to the L-terminal 24. The demodulator converts the PWM signals from the ECM 16 into a voltage upon which the generator output voltage is based. In addition to the PWM demodulator 70, the generator 12 includes an NPN bipolar junction transistor (BJT) 72 and an N-channel field-effect transistor (FET) 74. A base of the BJT 72 is electrically connected to the L-terminal 24 of the generator 12 via a resistor. The base is also electrically connected to an emitter of the BJT 72 via a resistor.

When an electrical signal at the L-terminal 24 is high, the voltage level at the base of the BJT 72 goes high and conducts. If the ECM 16 communicates a low or no electrical signal to the L-terminal 24, the high voltage level previously established at the base of the BJT 72 is reduced and eventually discharged through the resistor. As a result, the BJT 72 stops conducting and the generator 12 transitions to a default mode. The drain of the FET 74 is directly connected to the L-terminal 24 of the generator 12 and the source of the FET 74 is grounded. If a malfunction occurs in the generator 12, the FET 74 is turned on.

In the conduction mode, electrical signals communicated from the ECM 16 to the L-terminal 24 are shorted to ground via the drain and source of the FET 74. As a result, the BJT 72 stops conducting, disables the generator 12, and signals communicated from the ECM 16 are not processed by the PWM demodulator 70. Since the FET 74 is in conduction mode, the L-terminal 24 is shorted to ground, which reduces the voltage level at the L-terminal 24 to approximately zero. When this occurs, the fault detection circuit 68 in the ECM 16 senses the drop in the voltage level at the L-terminal 24 and alerts the ECM 16 that the generator 12 is malfunctioning or is in an inoperative state.

Figure 3:
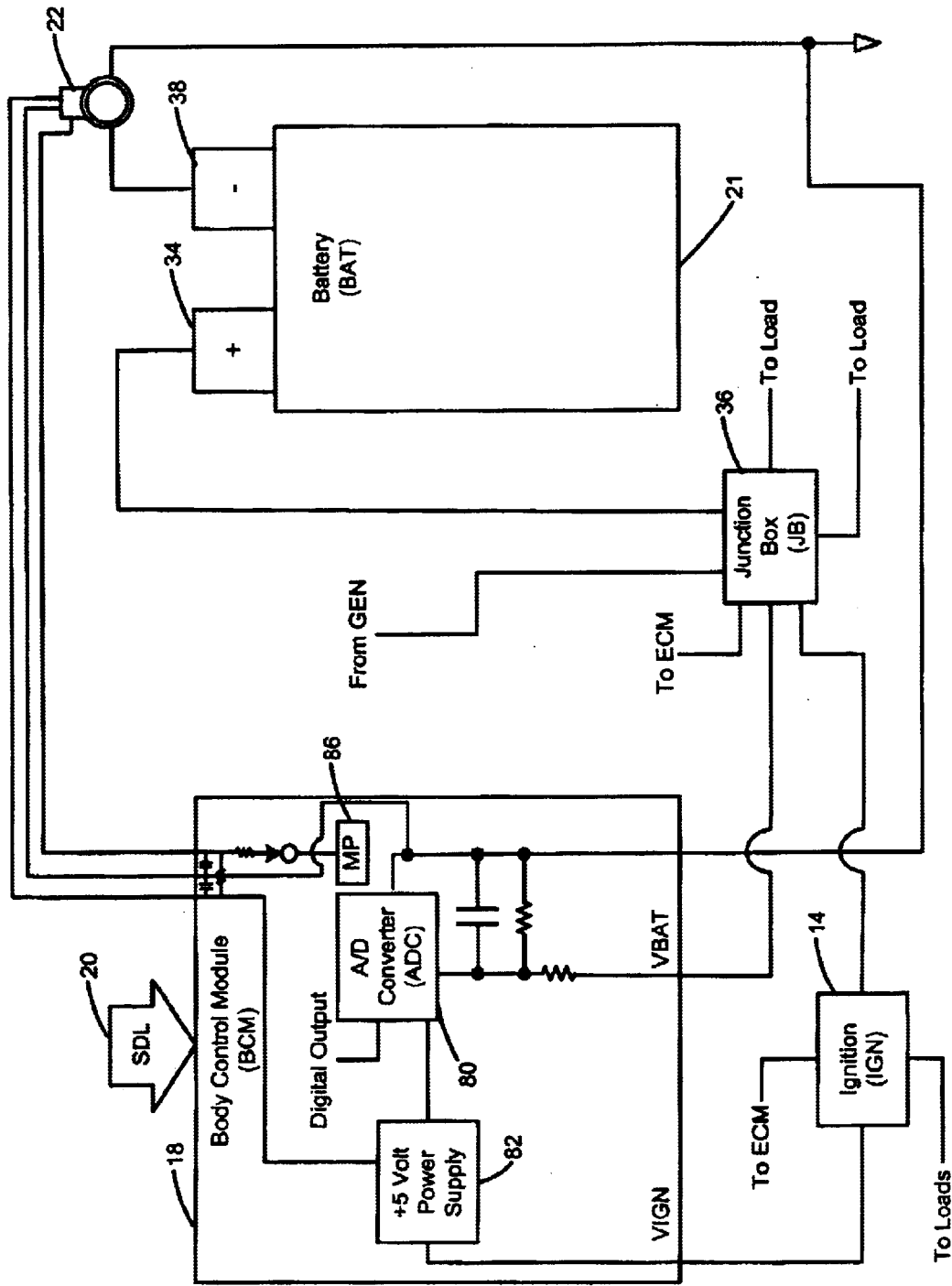
FIG. 3 is an electrical schematic showing a body control module (BCM), a current sensor, and the battery of the system of FIG. 1.

In FIG. 3, electrical connections between the BCM 18, the ignition system 14, the JB 36, the battery 21, and the current sensor 22 are shown. The BCM 18 includes an analog-to-digital (A/D) converter (ADC) 80 and a DC reference power supply 82. The ADC 80 is used by the BCM 18 to periodically sense the voltage level of the battery 21 via the JB 36 to enable the BCM 18 to estimate the SOC of the battery 21.

The ADC 80 is powered by the DC reference power supply 82. The voltage supplied to the ADC 80 by the reference power supply 82 is derived from the output voltage of the generator 12 or the battery 21. The current sensor 22 is connected to and powered by the BCM 18 via the power supply lead, ground lead, and the output signal lead of the connector. More specifically, the power supply lead is connected to the DC reference power supply 82 of the BCM 18, the ground lead is connected to the chassis ground 40 via the ground lead of the BCM 18, and the output signal lead is connected to the BCM 18.

It will be appreciated that the system 10 depicted in FIGS. 1 through 3 is somewhat simplified for the sake of clarity. As such, the system 10 is intended to facilitate a proper understanding of the operation and advantages of the present invention. Furthermore, it is to be understood that additional or fewer electrical loads may be incorporated within the system 10 other than those depicted herein.

Figure 4:
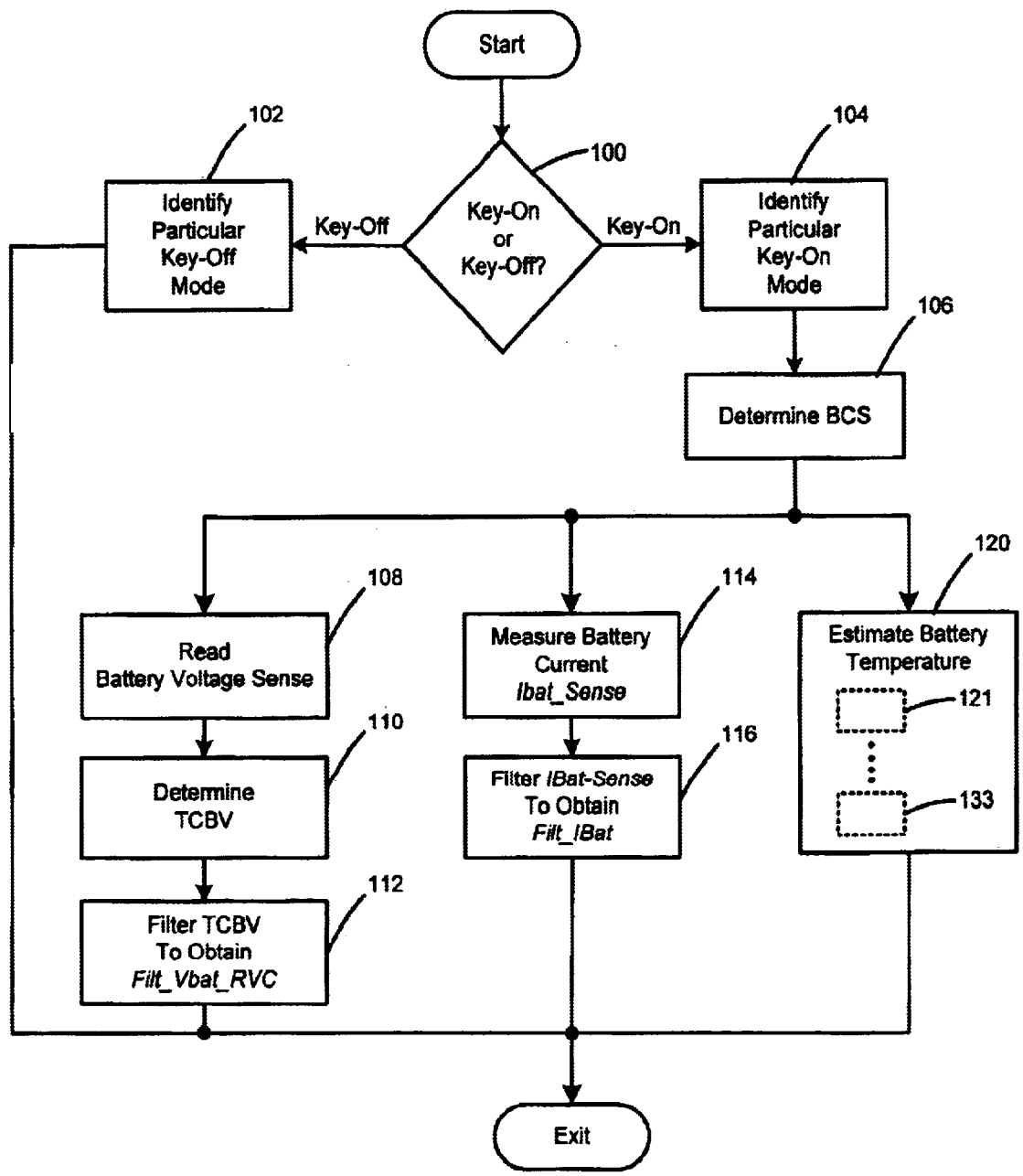
FIG. 4 is a flowchart illustrating steps of a battery charge status (BCS) algorithm of the present invention.
Figure 5:
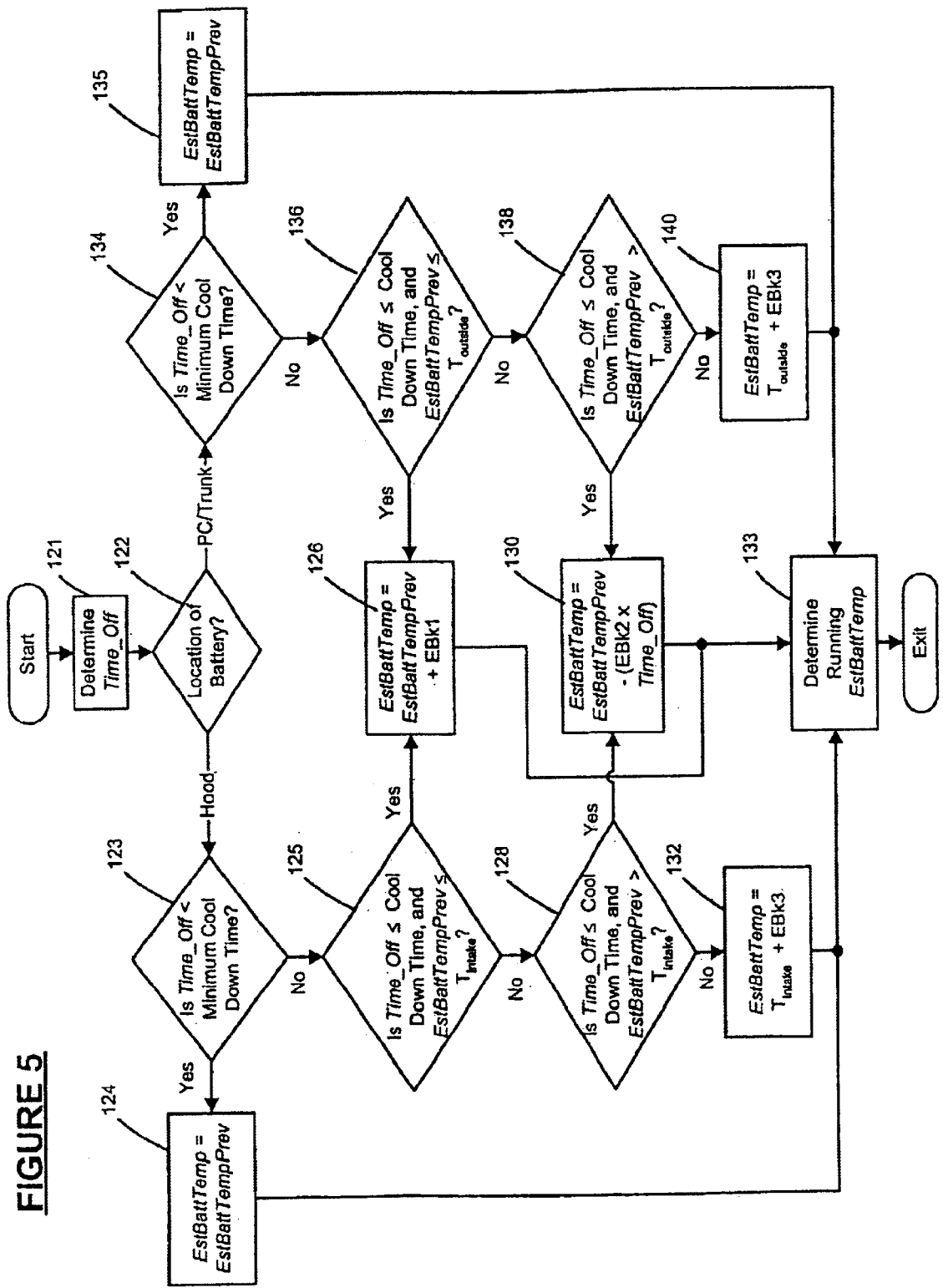
FIG. 5 is a flowchart illustrating steps of an estimated battery temperature algorithm of the present invention.

FIGS. 4 and 5 outline a battery charge status (BCS) algorithm of the present invention. The BCS algorithm runs in conjunction with additional algorithms, as will be described in further detail below. From a start step, control determines whether the system 10 is operating in either the key-off mode or the key-on mode in step 100. If the system 10 is operating in the key-off mode, control continues in step 102 where the particular key-off mode is identified. The key-off modes may include: Off, Off-Asleep, Off-Awake, and Accessory, although additional or fewer modes may be employed. If the system 10 is operating in the key-on mode, control continues in step 104 where the key-on mode is identified. The key-on modes include: Run, Run with Engine Running, Crank, Remote Start, and Off-Remote Start, although additional or fewer modes may be employed. Once the particular key-on mode is determined in step 104, control determines the BCS in step 106. The BCS is defined by factors including battery voltage, battery current, and battery temperature as will be detailed below.

The battery voltage is directly read from the analog-to-digital converter (ADC) 80 and then compensated for line drop, production variances, and ADC variances. The compensated voltage is then filtered to provide a battery voltage. In step 108, the ADC 80 reads the battery voltage and stores the voltage value as BatteryVoltageSense. In step 110, a total compensated battery voltage (TCBV) is determined using the following equation:

$$TCBV = \text{Battery Voltage Sense} + LD\text{Norm} + (RD\text{Status})(LDk1) + (\text{FanSpeed})(LDk2) + (\text{LowBeam})(LDk3) + ADC\_Error + TEMP\_Error + V\_Error$$

where:

LDNorm=normal line drop to battery (mV)

RDStatus=either 1 if rear defogger on, or 0 if off

FanSpeed=percentage (%)

LowBeam=either 1 if low beam on, or 0 if off

LDk1=calibration factor (mV)

LDk2=calibration factor (mV)

LDk3=calibration factor (mV)

ADC_Error=ADC production variance (mV)

TEMP_Error=ADC temperature variance (mV)

V Error=ADC voltage variance (mV)

ADC_Error is determined from a measurement taken after production of the BCM 18 and is stored in non-volatile memory. This factor is used to offset production variances. TEMP_Error relates to the sensitivity of the ADC 80 to temperature changes. This temperature sensitivity is stored in non-volatile memory as one or more constants. Finally, V_Error accounts for the sensitivity of the ADC 80 to voltage range and is stored in non-volatile memory.

TCBV is filtered in step 112 to obtain an average voltage Filt_VBat_RVC. This is achieved by updating a running average with each new TCBV sample. The average voltage is determined by the following equation:

$$Filt\_VBat\_RVC = Filt\_VBat\_RVC + (TCBV - Filt\_VBat\_RVC) \times (RFCVolt/256)$$

A time constant (T) for the filter is calibrated and determined by RFCVolt in accordance with Table 1.

TABLE 1

| $t_{sample}$ (s) | 0.5 | 0.5 | 0.5 | 0.5 | 0.5 | 0.5 | 0.5 | 0.5 |
|---|---|---|---|---|---|---|---|---|
| T (s) | 1 | 3 | 5 | 10 | 21 | 32 | 64 | 128 |
| FCVolt | 100 | 39 | 24 | 12 | 6 | 4 | 2 | 1 |

RFCVolt is provided as:

$$RFCVolt = 256 \times (1 - \exp(-t_{sample}/T))$$

RFCVolt is calibrated based upon the desired degree of filtering required to eliminate transients on the battery line and the desired time delay for responding to voltage changes. A typical value for T is between 1 s and 5 s.

In step 114, the battery current is measured by the current sensor 22. A pulse width-modulated (PWM) signal (125 Hz±20 Hz) is generated by the current sensor 22 and is output to the BCM 18. To minimize the effect on the BCM 18, the rise and fall time ($t_{rise}$, $t_{fall}$) of the PWM signal is 10 µs±50%. The BCM 18 determines the percent duty cycle (%DC) of the PWM signal by calculating a ratio of the positive part of the 125 Hz cycles to the negative (or ground) part of the cycle. The resultant value is converted into the battery current (I) per the following equation:

$$I = [(\%DC - 50\%)/40\%] \times 60A$$

The battery current (I) is read via an input capture timer every 50 ms. In step 116, an average value of ten (10) samples is stored in the memory as IBat_Sense. IBat_Sense is filtered with a first-order filter to obtain an average current Filt_IBat. This can be achieved by updating a running average (every 0.5 s) with each new sample of current using the following formula:

$$Filt\_IBat = Filt\_IBat + (IBat\_Sense - Filt\_IBat) \times (FCAmp/256)$$

FCAmp is determined similarly to RFCVolt, as described above with reference to Table 1.

The battery temperature is estimated in step 120. The battery estimation algorithm will be described with reference to FIG. 5. The battery temperature is preferably estimated every 1 s. In step 121, a time off value (TimeOff) is determined by monitoring the transition between key-on and key-off modes. TimeOff indicates the length of time the system 10 was in the key-off mode. When the system 10 previously transitioned from key-on mode to key-off mode, the estimated battery temperature calculated at that time is stored into non-volatile memory as EstBattTempPrev. The time when the transition occurred is saved as TimeKeyOff. When the vehicle transitions from the key-off mode to the key-on mode, the TimeOff is determined as the difference between the present time, as indicated by a timer of the BCM 18, and TimeKeyOff. In step 122, the location of the battery 21 is signaled as either within the passenger compartment, trunk, or under the hood. The location of the battery 21 is preset and stored within the non-volatile memory of the BCM 18.

If the battery 21 is located under the hood, a comparison is made in step 123 between TimeOff and a cool down time range. The cool down time (such as fours hours) and the minimum cool down time (such as 15 minutes) are preset and stored in the memory. If TimeOff is less than the minimum cool down time then the initial estimated battery temperature (EstBattTemp) is set equal to EstBattTempPrev in step 124. In step 125, TimeOff is compared to the cool down time and EstBattTempPrev is compared to a present engine air intake temperature ($T_{intake}$) which is measured by the IAT sensor. If TimeOff is less than or equal to the cool down time and if EstBattTempPrev is less than or equal to the present engine air intake temperature, EstBattTemp is provided at step 126 as:

$$EstBattTemp = EstBattTempPrev + EBk1$$

If TimeOff is less than the cool down time and if EstBattTempPrev is greater than the present engine air intake temperature, as determined in step 128, the initial EstBattTemp is provided at step 130 as:

$$EstBattTemp = EstBattTempPrev - (EBk2 \times TimeOff)$$

Otherwise, the initial EstBattTemp is provided at step 132 as:

$$EstBattTemp = T_{intake} + EBk3$$

For the above-described equations, the values EBk1, EBk2, and EBk3 are calibration constants, respectively measured in °C., °C./hour, and °C. Each is preset and stored in the non-volatile memory.

Having determined the initial EstBattTemp (i.e. the battery temp after transitioning from key-off mode to key-on mode), the running EstBattTemp is determined periodically in step 133, according to the following equation:

$$EstBattTemp = EstBattTemp + (T_{intake} - EstBattTemp) \ast (1/TC)$$

TC is a thermal constant derived from measured electrolyte temperature data. The EstBattTemp is capped by minimum and maximum temperature values. If the EstBattTemp is greater than the maximum value, it is set equal to the maximum value. If EstBattTemp is less than the minimum value, it is set equal to the minimum value.

If the battery 21 is located in either the passenger compartment or the trunk, a comparison is made between TimeOff and the cool down time range. In step 134, if TimeOff is less than the minimum cool down time then the initial estimated battery temperature (EstBattTemp) is set equal to EstBattTempPrev in step 135. TimeOff is compared to the cool down time and EstBattTempPrev is compared to a present outside air temperature ($T_{outside}$) in step 136. $T_{outside}$ is measured by an external temperature sensor (not shown) that is in communication with the BCM 18. If TimeOff is less than or equal to the cool down time, and if EstBattTempPrev is less than or equal to the present outside air temperature, the initial estimated battery temperature (EstBattTemp) is provided at step 126 as:

$$EstBattTemp = EstBattTempPrev + EBk1$$

If TimeOff is less than the cool down time and if EstBattTempPrev is greater than the present outside air temperature, at step 138, the initial EstBattTemp is provided at step 130 as:

$$EstBattTemp = EstBattTempPrev - (EBk2 \times TimeOff)$$

Otherwise, the initial EstBattTemp is provided at step 140 as:

$$\text{EstBattTemp} = T_{outside} + EBk3$$

Having determined the initial EstBattTemp (i.e. the battery temp after transitioning from key-off mode to key-on mode), the running EstBattTemp is determined periodically in step 133, according to the following equation:

$$\text{EstBattTemp} = \text{EstBattTemp} + (\text{RunTime} \times \text{TempSlope})$$

RunTime is the elapsed time since transitioning to the key-on mode, as monitored by the BCM 18. TempSlope is a constant set at 1° C. per every 20 minutes. The EstBattTemp is capped by minimum and maximum temperature values. If the EstBattTemp is greater than the maximum value, it is set equal to the maximum value. If EstBattTemp is less than the minimum value, it is set equal to the minimum value.

Having determined Filt_VBat_RVC, Filt_IBat, and EstBattTemp, the running SOC (RunSOC) of the battery 24 is determined. RunSOC is provided as a percentage (%), and is determined by the following equation:

$$\text{RunSOC} = \text{StartUpSOC} + (100\% \times \text{AdjAmpHrs})/\text{BatteryCapacity}$$

The value of RunSOC is capped by minimum (0%) and maximum (100%) values. If the RunSOC is greater than 100%, it is set equal to 100%, if RunSOC is less than 0%, it is set equal to 0%.

StartUpSOC is the SOC of the battery 21 when a transition from key-off mode to the key-on mode occurs. The StartUpSOC is dependent upon the TimeOff value. The BCM 18 compares TimeOff to a preprogrammed rest time. If TimeOff is equal to or greater than the rest time, an estimated value for StartUpSOC is a function of EstBattTemp (° C.) and Open circuit Battery Voltage (VBat_OCV) (Volts), as obtained from a look-up table, such as the following:

specifically, Filt_IBat is integrated to provide a value for the net AdjAmpHrs into the battery 21. In general, as the SOC decreases during a period, such as idle, the battery 21 is discharged and becomes electrically weakened. During this period, the value for AdjAmpHrs correspondingly decreases. When the transition occurs from key-off mode to key-on mode, the value for AdjAmpHrs is initialized to 0. After the brief initialization period, a value for AdjAmpHrs is calculated in accordance with the following equation:

$$\text{AdjAmpHrs} = \text{AdjAmpHrs}_{PREV} + (\text{Filt\_IBat} \times \text{TIME}_{INT})/3600$$

$\text{AdjAmpHrs}_{PREV}$ represents the last calculated value for AdjAmpHrs. The time interval $\text{TIME}_{INT}$ represents the sample execution rate. The value of AdjAmpHrs is capped by minimum and maximum values. If the AdjAmpHrs is greater than the maximum value, it is set equal to the maximum value. If AdjAmpHrs is less than the minimum value, it is set equal to the minimum value.

BatteryCapacity is a calibrated variable that represents the inherent power capacity of the battery 21. This is a predetermined constant stored In the non-volatile memory. Battery capacity is based, for example, on a 20-hour battery discharge test conducted at 25° C.

Figure 6:
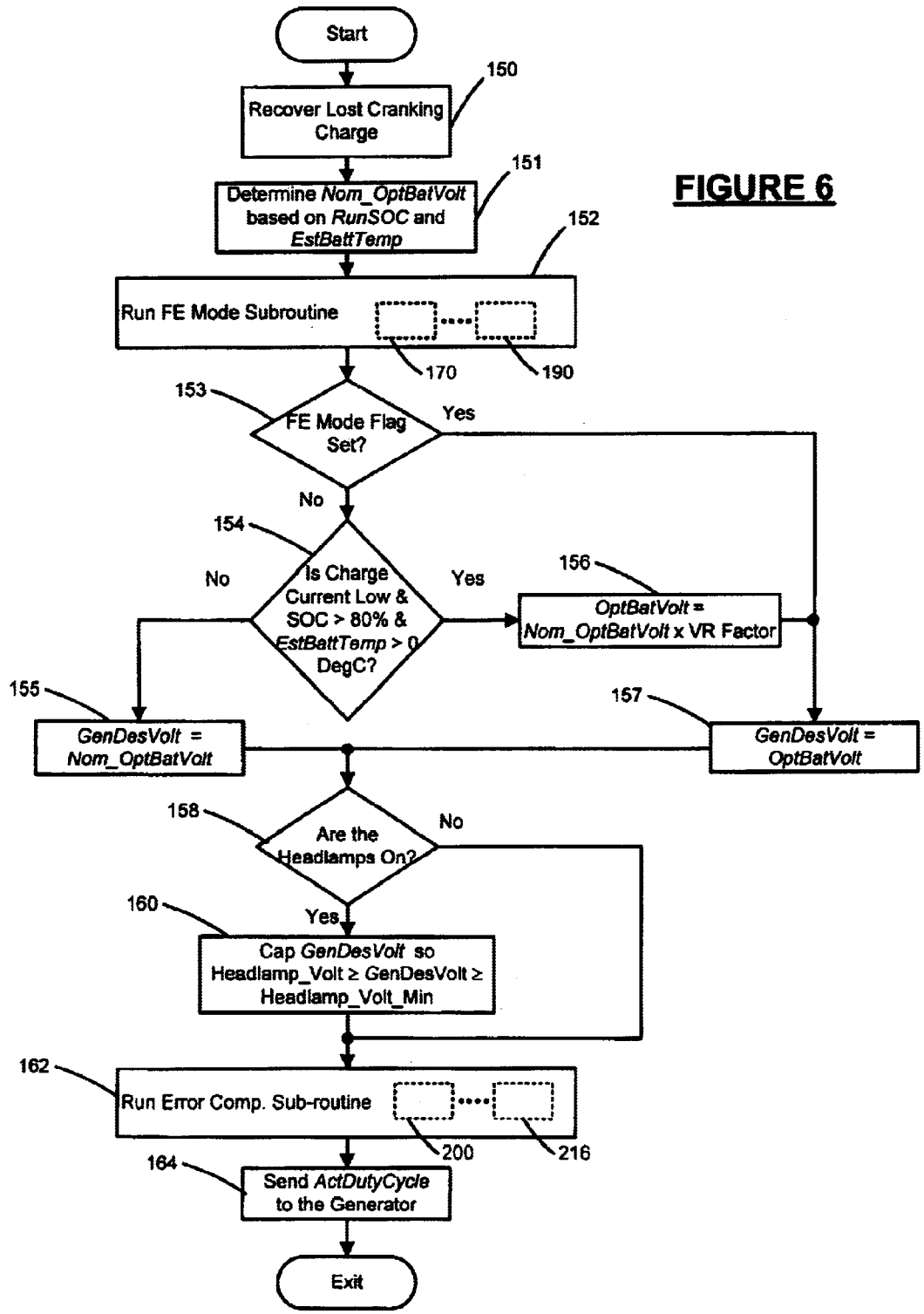
FIG. 6 is a flowchart illustrating steps of a regulator voltage control (RVC) algorithm of the present invention.

The BCM 18 executes three main algorithms: regulator voltage control (RVC), fuel economy (FE), and battery sulfation protection (BSP). With particular reference to FIG. 6, the RVC algorithm includes two main sub-routines, battery current voltage reduction (BCVR) and headlamp voltage reduction (HVR). The RVC algorithm signals operation of the voltage regulator for charging the battery 21 to a particular level. The voltage regulator is signaled depending upon the need for a high charging voltage or whether the headlamps (i.e. high current drawing accessory) are on.

The RVC algorithm determines the optimum charging voltage based upon estimates of the SOC of the battery 21 and the temperature of the battery electrolyte. The optimum charging voltage is defined as the battery charge voltage that results in maximum battery life while maintaining energy storage for engine start-up (i.e., cranking), discharge at idle,

TABLE 2

| StartUpSOC | EstBattTemp (° C.) | | | | | |
|---|---|---|---|---|---|---|
| (%) | −29 | −18 | 0 | 25 | 52 | |
| 100 | 12.760 | 12.760 | 12.894 | 12.830 | 12.890 | VBat_OCV (Volts) |
| 90 | 12.570 | 12.570 | 12.720 | 12.755 | 12.770 | |
| 80 | 12.380 | 12.380 | 12.546 | 12.680 | 12.650 | |
| 70 | 12.287 | 12.287 | 12.438 | 12.570 | 12.537 | |
| 60 | 12.193 | 12.193 | 12.330 | 12.460 | 12.423 | |
| 50 | 12.100 | 12.100 | 12.222 | 12.350 | 12.310 | |
| 40 | 12.007 | 12.007 | 12.114 | 12.240 | 12.197 | |
| 30 | 11.913 | 11.913 | 12.006 | 12.130 | 12.083 | |
| 20 | 11.820 | 11.820 | 11.898 | 12.020 | 11.970 | |
| 10 | 11.727 | 11.727 | 11.790 | 11.910 | 11.857 | |
| 0 | 11.633 | 11.633 | 11.682 | 11.800 | 11.743 | |

The precise value for StartUpSOC is interpolated from the data presented in Table 2, above. It is appreciated that the values of Table 2 are merely exemplary in nature and will vary based on the particular vehicle battery system.

If, however, TimeOff is less than the predetermined rest time, the value for StartUpSOC is set equal to the last value estimated (SOC_Prev) in the last key-on mode. SOC_Prev is saved in the non-volatile memory immediately prior to the transition from key-on to key-off modes.

AdjAmpHrs is determined using Filt_IBat, which is based upon IBat_Sense as described in detail above. More and parasitic loads. The optimum charging voltage is converted to a pulse-width modulated (PWM) % duty cycle command (see FIG. 8) that is sent to the ECM 16 via the SDL 20. The ECM 16 outputs the PWM % duty cycle to the L-line of the voltage regulator, which adjusts the regulated voltage set-point according to the PWM % duty cycle.

The BCM 18 measures the battery voltage, as described In detail above, and adjusts the regulated voltage to compensate for line drop between the generator 12 and the battery 21. The RVC algorithm is executed by the BCM 18 at a nominal rate of approximately 3 to 5 seconds, indicated as RVCUpDate, when the engine is running. Additionally, the BCM 18 reads the field duty cycle of the generator 12 to determine whether the generator 12 is operating at full charging capacity. If the generator 12 is operating at full charging capacity, an error compensation sub-routine, described in detail below, is not executed by the BCM 18.

In step 150, after initial start-up, the battery charge lost during cranking is recovered by control commanding the generator 12 to operate at an increased PWM % duty cycle (Gen_StartUp_DC), for a predetermined time (Gen_StartUp_Time). After the generator 12 charges the battery 21 at Gen_StartUp_DC for Gen_StartUp_Time seconds, control adjusts the PWM % duty cycle command to charge the battery at a nominal optimum voltage (Nom_OptBatVolt) or to reduce the battery voltage to a level as determined by the FE mode.

The Nom_OptBatVolt is determined in step 151 based on RunSOC. More particularly, the Nom_OptBatVolt is determined using four equations that depend upon the value of RunSOC and EstBattTemp. Table 3, below, describes the four equations.

TABLE 3

| | Nom_OptBatVolt | | | |
|---|---|---|---|---|
| EstBatt Temp (° C.) | Upper Limit RunSOC < 70% | Nominal Value RunSOC = 80% | Float Limit 1 RunSOC = 90% | Float Limit 2 RunSOC = 100% |
| 52 | 16.14 | 15.17 | 14.33 | 12.97 |
| 25 | 15.34 | 14.74 | 14.31 | 13.16 |
| 0 | 14.59 | 14.35 | 14.29 | 13.3 |
| −18 | 14.59 | 14.35 | 14.29 | 13.3 |
| −30 | 14.59 | 14.35 | 14.29 | 13.3 |

It is appreciated that the values of Table 3 are merely exemplary in nature and will vary based on the particular vehicle battery system. Control linearly interpolates with respect to both EstBattTemp and RunSOC to determine Nom_OptBatVolt. Data that is outside the bounds of Table 3 is capped to the last value appearing.

If the RunSOC is less than or equal to 70%, then Nom_OptBatVolt is calculated by the following equations:

Nom_OptBatVolt=[(EstBattTemp−$EBT\_K1$)×$RVCk5$+$RVCk6$] for EstBattTemp≧$EBT\_K1$ Nom_OptBatVolt=$RVCk6$ for EstBattTemp<$EBT\_K1$ If the RunSOC is equal to 80%, then Nom_OptBatVolt is calculated by the following equations:

Nom_OptBatVolt=[(EstBattTemp−$EBT\_K2$)×$RVCk1$+$RVCk2$] for EstBattTemp≧$EBT\_K2$ Nom_OptBatVolt=$RVCk2$ for EstBattTemp<$EBT\_K2$ If the RunSOC is equal to 90%, then Nom_OptBatVolt is calculated by the following equations:

Nom_OptBatVolt=[(EstBattTemp−$EBT\_K3$)×$RVCk3$+$RVCk4$] for EstBattTemp≧$EBT\_K3$ Nom_OptBatVolt=$RVCk4$ for EstBattTemp<$EBT\_K3$ If the RunSOC is equal to 100%, then Nom_OptBatVolt is calculated by the following equations:

Nom_OptBatVolt=[(EstBattTemp−$EBT\_K4$)×$RVCk7$+$RVCk8$] for EstBattTemp≧$EBT\_K4$ Nom_OptBatVolt=$RVCk8$ for EstBattTemp<$EBT\_K4$ For the above equations, the variables RVCk1 through RVCk8 and EBT_K1 through EBT_K4 are calibrated parameters. Exemplary values for these variables are provided in Table 4.

TABLE 4

| Variable | Calibrated Value | Unit |
|---|---|---|
| RVCk1 | 0.0158 | Volts/° C. |
| RVCk2 | 14.349 | Volts |
| RVCk3 | 0.0008 | Volts/° C. |
| RVCk4 | 14.29 | Volts |
| RVCk5 | 0.0298 | Volts/° C. |
| RVCk6 | 14.592 | Volts |
| RVCk7 | −0.0064 | Volts/° C. |
| RVCk8 | 13.306 | Volts |
| EBT_K1 | 0 | ° C. |
| EBT_K2 | 15 | ° C. |
| EBT_K3 | 34 | ° C. |
| EBT_K4 | 25 | ° C. |

It is appreciated that the values provided in Table 4 are merely exemplary and may vary based on the particular vehicle battery system.

The FE sub-routine is run in step 152. The FE sub-routine will be described in further detail hereinbelow, with reference to FIG. 7. In step 153, control determines whether an FE mode flag has been set. If the FE mode flag has been set, control continues in step 157. If not, control continues In step 154.

In step 154, control determines whether the battery charging current is below a predetermined value (i.e., is low), whether RunSOC is greater than 80%, and whether EstBattTemp is greater than 0° C. If any of these conditions is not true, the generator 12 is commanded to operate based on Nom_OptBatVolt in step 155. If these condition are true, the battery 21 does not require a high charging voltage. In this case, control initiates the BCVR sub-routine in step 156 to command a lower charging voltage. The lower charging voltage OptBatVolt is determined in step 156. OptBatVolt is based on Nom_OptBatVolt, as provided by the following equation:

OptBatVolt=Nom_OptBatVolt×$VR\_Factor$

VR_Factor is a voltage reduction factor and is generally equal to 1.0, except when the following conditions are detected: Filt_IBat is less than 2 Amps and greater than −7 Amps, EstBattTemp Is greater than 0° C., and the generator field duty cycle is less than 99%. If each of these conditions is detected, the BCVR sub-routine initiates a first delay (VR_Delay1), for example 1 minute. At the expiration of VR_Delay1, the BCVR sub-routine slowly reduces Nom_OptBatVolt to approximately 87%. In other words, VR_Factor is gradually reduced from 1.0 to 0.87. The calibration factor VR_K1 defines the reduction level of Nom_OptBatVolt and the calibration factor VR_K2 defines the rate of change of VR_Factor. VR_K2 is preferably provided as 0.05830%/s, or 8.45 mV/s. If any of the above-described conditions becomes false for a period longer than a second delay (VR_Delay2), for example 1 minute, VR_Factor is gradually increased back to 1.0. The rate of the increase may be the same as that as described above for the decrease.

In step 157, the commanded voltage to the generator 12, defined as GenDesVolt, is set equal to OptBatVolt. In step 158, control determines whether the headlamps are on. If the headlamps are not on, control continues in step 162. If the headlamps are on, control continues in step 160. In step 160, control caps GenDesVolt such that it is less than or equal to the headlamp voltage (Headlamp_Volt) and greater than or equal to a minimum headlamp voltage (Headlamp_Volt_Min).

In step 162, control implements a closed loop current control (CLCC) sub-routine that determines an actual duty cycle (ActDutyCycle) for the generator 12. The CLEC sub-routine will be described in detail hereinbelow, with reference to FIG. 8. In step 164, the generator 12 is commanded to operate at ActDutyCycle, and control ends.

Figure 7:
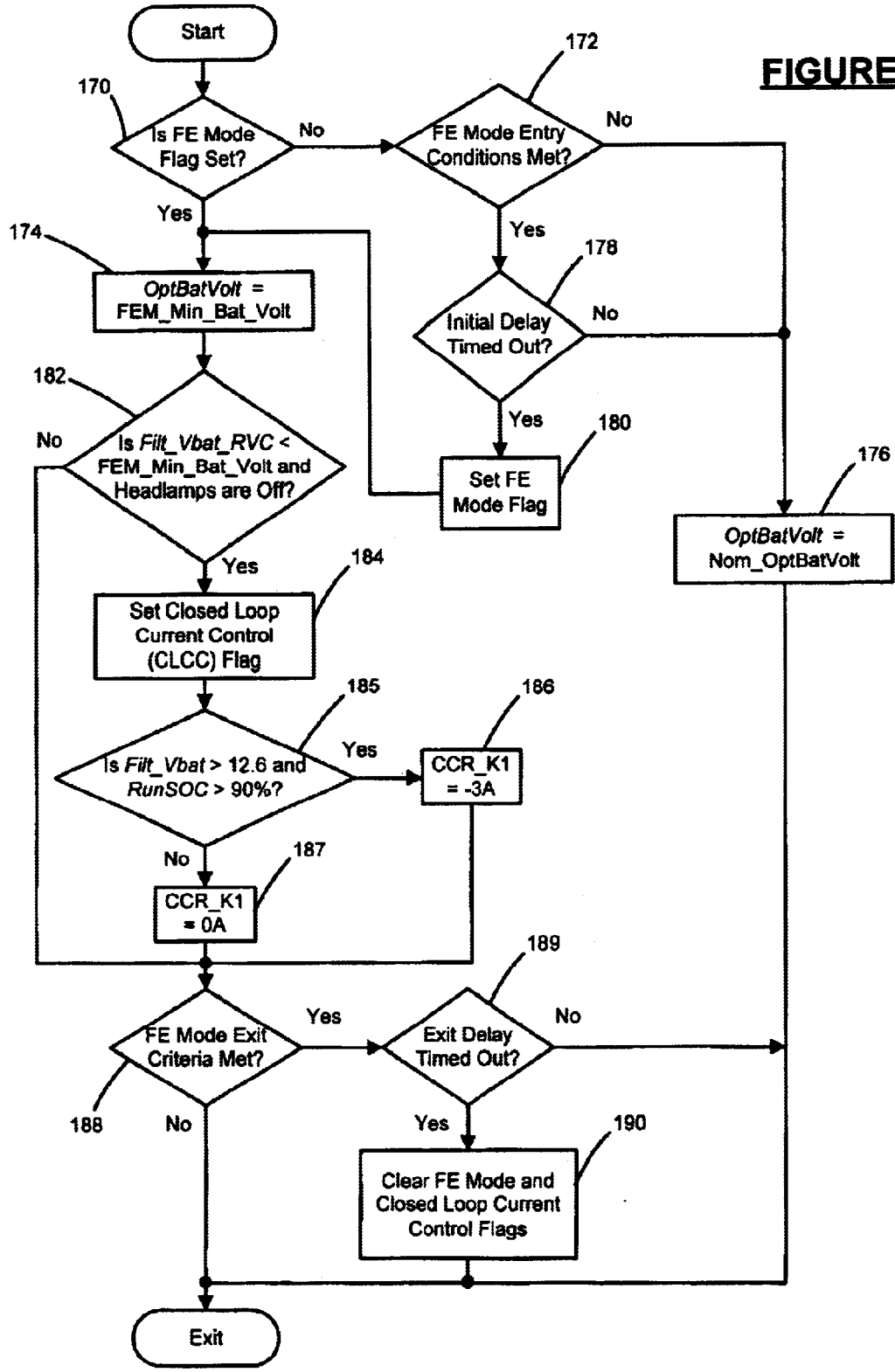
FIG. 7 is a flowchart illustrating steps of a fuel economy (FE) algorithm of the present invention.

Referring now to FIG. 7, the FE sub-routine will be described in detail. In step 170, control determines whether the FE mode flag is set. If not, control continues in step 172. If so, control continues in step 174. In step 172, control determines whether certain pre-conditions are met for entering the FE mode. Exemplary pre-conditions include:

RunSOC>80%

$40°\,C.>T_{outside}0°\,C.$

Vehicle Speed<70 mph

Current Sensor is Functional $FE\_BC1 \leq Filt\_Ibat \leq FE\_BC2$

FE_Low Volt=0

Headlamps are Off

It is appreciated that the values of the pre-conditions are merely exemplary and may vary based on battery type and particular vehicle characteristics.

If the pre-conditions are not met, control continues in step 176 by setting OptBatVolt equal to Nom_OptBatVolt, and exits the FE sub-routine. If the pre-conditions are met, control continues in step 178 to determine whether an initial delay time has expired. If the initial delay time has not expired control continues in step 176. Otherwise, control continues in step 180, setting the FE mode flag. After setting the FE mode flag, control continues in step 174.

In step 174, OptBatVolt is set equal to FEM_Min_Bat_Volt. The rate of change of the reduction is defined by the calibration value FEM_VR_K1, and is generally provided as 12 seconds per 0.6V. Control continues in step 182 to determine whether Filt_Vbat_RVC is less than FEM_Min_Bat_Volt and whether the headlamps are off. If both are true, control continues in step 184. Otherwise control continues in step 188. In step 184 control sets a closed loop current control (CLCC) flag. In step 185, control determines whether Filt_Vbat is greater than 12.6V and Run_SOC>90%. If both are true, control sets a current control factor (CCR_K1) equal to −3A in step 186. Otherwise, control sets CCR_K1 equal to 0A in step 187. It is appreciated that these values are merely exemplary and may vary based on battery type and particular vehicle characteristics.

In step 188, control checks whether FE mode exit conditions are met. If any one of the following conditions is not met, control exits the FE mode sub-routine:

RunSOC≦80%

$40°\,C.<T_{outside} \leq 0°\,C.$

Vehicle Speed>70 mph

Current Sensor is Non-Functional

FE_BC2<Filt_Ibat<FE_BC1

Filt_VBat<Batt_Volt_CLCC_Min

Headlamps are On

If these conditions are met, control continues in step 188 to determine whether an exit delay time has expired. If the delay time has not expired, control exits the FE mode subroutine. If the delay time has expired, control clears both the FE mode and CLCC flags in step 190 and exits the FE mode subroutine.

Figure 8:
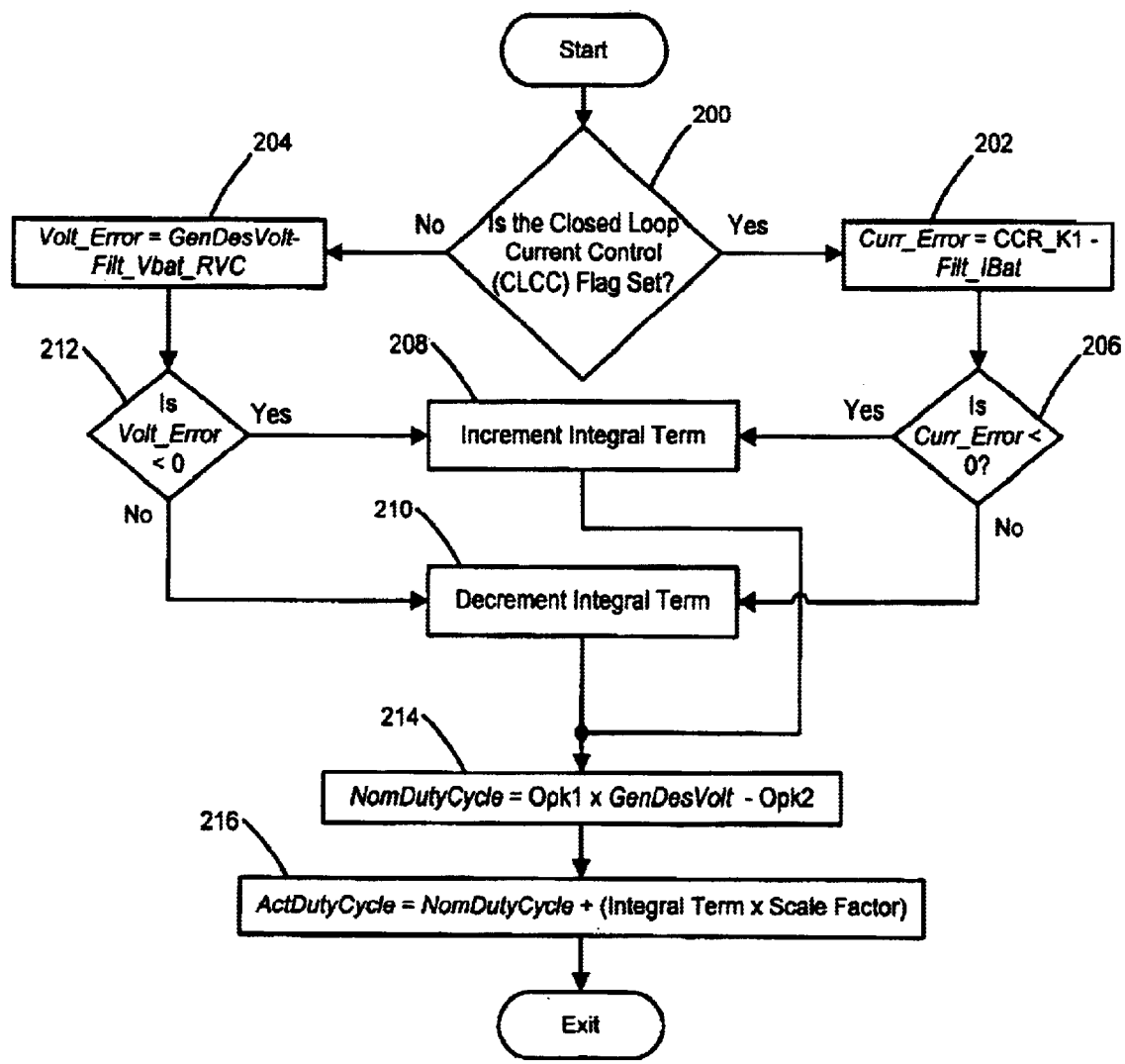
FIG. 8 is a flowchart illustrating steps of an error correction algorithm.
Figure 9:
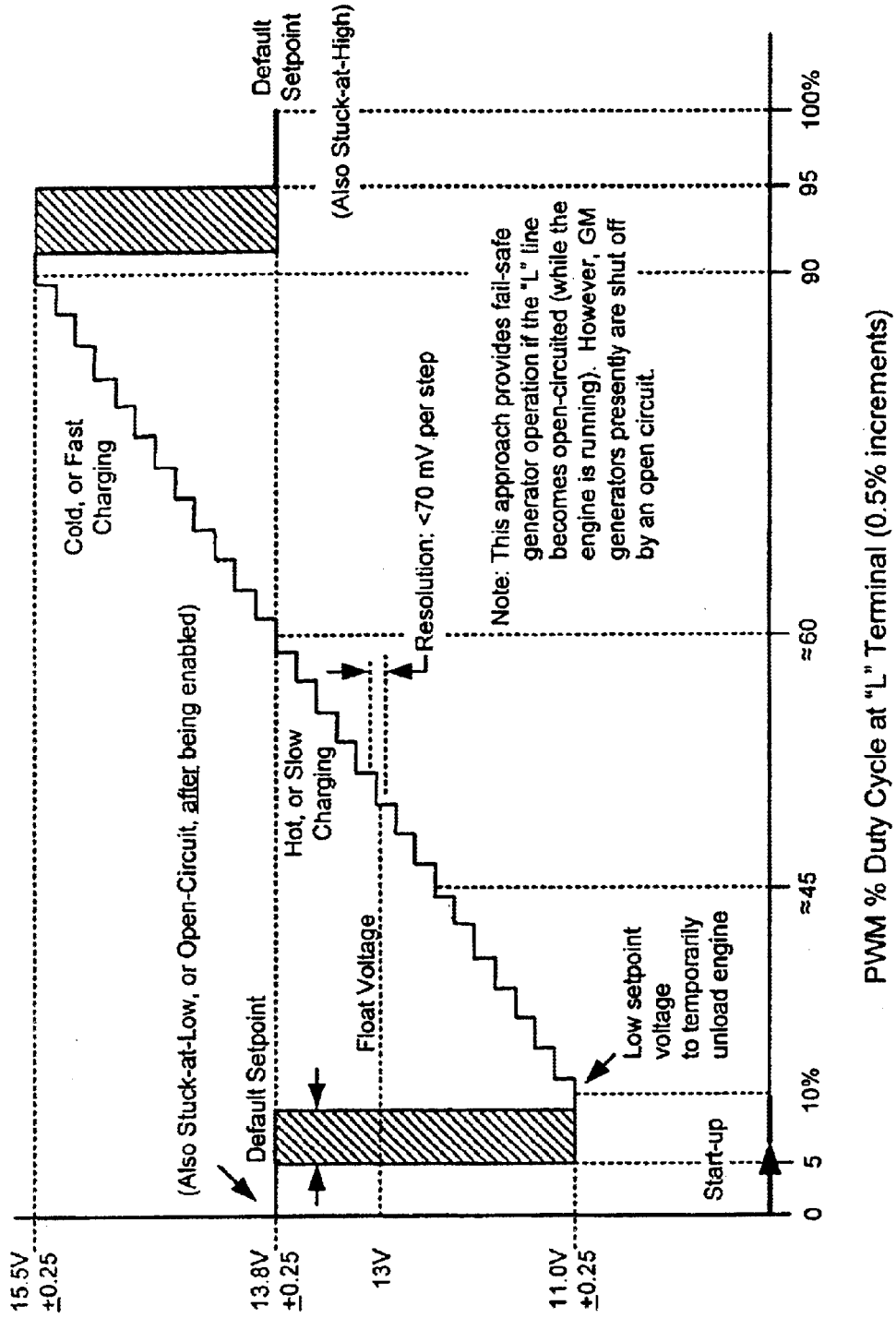
FIG. 9 is a graph showing generator output voltage as a function of pulse width modulated (PWM) duty cycle according to the present invention.

Referring now to FIG. 8, the CLCC sub_routine corrects for voltage or current errors using an integral term. Upon transition from the key-off mode to the key-on mode, the integral term is zeroed. The integral term is subject to the following operational limitations, based upon the generator field duty cycle:

a) If generator field duty cycle≧99%, then the integral term freezes at current level.

b) If generator field duty cycle≧99%, then the integral term operates to reduce Volt_Error.

c) If a fault is reported, then Filt_Vbat_RVC is used to determine generator field duty cycle. If Filt_Vbat_RVC<12.8V, then assumption is made that generator field duty cycle is≧99%. Otherwise it is assumed that generator field duty cycle is<99%.

The desired voltage to the generator 12, defined as GenDesVolt, is determined by the following equation:

$$GenDesVolt = OptBatVolt + Gen\_Bat\_Linedrop$$

Gen_Bat_Linedrop is the voltage line drop that results in the connection between the generator 12 and the battery 21, and is a predefined calibration constant, preferably having a calibrated value of 0.1V. GenDesVolt is converted to the duty cycle by the BCM 18 before being sent to the ECM 16.

In step 200, control determines whether the CLCC flag is set. If so, control continues in step 202. If not, control continues in step 204. An integral term operates to slowly correct the duty cycle sent to the voltage regulator. In step 202, a current error (Curr_Error) is determined as:

$$Curr\_Error = CCR\_K1 - Filt\_IBat$$

In step 206, control determines whether Curr_Error is less than zero. If so, the integral term is incremented by one in step 208. If not, the integral term is decremented by one in step 210.

In step 204, a voltage error (Volt_Error) is determined as:

$$Volt\_Error = GenDesVolt - Filt\_Vbat\_RVC$$

In step 212, control determines whether Curr_Error is less than zero. If so, the integral term is incremented by one in step 208. If not, the integral term is decremented by one in step 210.

In step 216, GenDesVolt is converted to the duty cycle by the BCM 18 before being sent to the ECM 16. The following linear equation defines the conversion to the duty cycle:

$$NomDutyCycle = Opk1 \times GenDesVolt - Opk2$$

Opk1, and Opk2 are predefined calibration constants, preferably having values of 17.76%/V, and 185.6, respectively.

In step 218, control calculates ActDutyCycle according to the following equation:

$$ActDutyCycle = NomDutyCycle + (Integral\ Term \times Scale\ Factor)$$

Scale Factor is a predefined calibration constant, preferably having a value of 0.392%/counts. Control then exits the CLCC sub-routine. As described above, ActDutyCycle is sent from the BCM 18 to the ECM 16 via the SDL 20. The ECM 16 then signals the voltage regulator accordingly. ActDutyCycle is limited to an exemplary minimum value of 36%. If the ECM 16 recognizes that ActDutyCycle is less than 36%, the ECM 16 signals the voltage regulator to 100% duty cycle until ActDutyCycle is greater than the 36% threshold. In the case of loss of the SDL 20, the ECM 16 signals the voltage regulator to 100% duty cycle.

The BSP algorithm protects the battery 21 from potential sulfation, which is a chemical reaction that occurs when the battery cells are in an open circuit (i.e. self discharge) or in a discharged condition for an extended period of time. The BSP algorithm continuously checks the battery voltage (OpBatVolt) to determine whether it is less than 13.2V. If so, a 30-minute timer is initialized. During the 30 minute time period, if the battery voltage is increased above 13.2V, the timer is reset to zero. However, if the battery voltage is still less than 13.2V at the expiration of the 30-minute time period, the BSP algorithm slowly increases the battery voltage to Nom_OpBatVolt. The battery voltage remains at Nom_OpBatVolt for three minutes before the BCM is able to implement any other algorithms, such as BCVR or FE. The rate of change of the battery voltage to Nom_OpBatVolt is defined by FEM_VR_K1, as described in detail above.

The present invention operates the battery around a higher charging efficiency point that corresponds to a lower SOC level (i.e., 80% instead of 90+% that is seen in other electric power management strategies) whenever feasible. Further, the present invention stops charging the battery when it is not needed. This reduces average electric power generation required from the generator. This also reduces the load exerted by the generator on the engine or another power provider such as a DC to DC converter in a hybrid vehicle application. The reduction of electrical load on the power source results in less fuel consumption by the engine and better fuel economy for the vehicle.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A fuel economy control method comprising:

measuring current supplied by a battery;

determining a state of charge (SOC) of said battery; determining a nominal optimum charging voltage of said battery; and reducing said nominal optimum charging voltage to a fuel economy minimum charging voltage if said SOC is above a predetermined level and said current is within a predetermined range.

2. The method of claim 1 wherein said predetermined level is approximately 80%.

3. The method of claim 1 wherein said predetermined range is between −8 A and 15 A.

4. The method of claim 1 wherein said step of reducing is performed if an outside air temperature is within a first temperature range, a vehicle speed is less than a predetermined speed, and an accessory is off.

5. The method of claim 4 wherein said accessory is headlamps.

6. The method of claim 1 wherein said nominal optimum charging voltage is based on said SOC.

7. The method of claim 1 further comprising:

estimating a temperature of said battery; and measuring a voltage of said battery, wherein said SOC is based upon said temperature, said voltage, and said current.

8. The method of claim 1 further comprising:

converting said fuel economy minimum charging voltage to a % duty cycle; and charging said battery at said fuel economy minimum charging voltage using a generator based on said % duty cycle.

9. The method of claim 8 further comprising:

determining a difference between said current and a predetermined current value; and adjusting said % duty cycle until said current is equal to said predetermined current value.

10. The method of claim 8 further comprising:

converting said % duty cycle to a pulse-width modulated (PWM) % duty cycle; and operating said generator based on said PWM % duty cycle.

11. The method of claim 1 wherein reducing said nominal optimum charging voltage is achieved at a rate of 0.05V/s.

12. The method of claim 1 wherein determining said nominal optimum charging voltage includes:

determining a running SOC of said battery;

interpolating a value of said nominal optimum charging voltage based on said running SOC and said temperature.

13. The method of claim 12 wherein interpolating is based upon a plurality of calibration constants.

14. The method of claim 12 further comprising determining said running SOC as a function of a start-up SOC, an adjusted amp-hours of said battery and battery capacity.

15. The method of claim 14 wherein said start-up SOC is determined using a look-up table that is accessed using an estimated temperature of said battery and a last stored open-circuit voltage.

16. The method of claim 14 wherein said start-up SOC is determined as a function of a plurality of start-up calibration constants, wherein at least one of said start-up calibrations constants is dependent upon an estimated temperature of said battery.

17. A fuel economy control method, comprising:

estimating a temperature of a battery;

measuring current supplied by said battery;

measuring a voltage of said battery;

determining a nominal optimum charging voltage as a function of a state of charge (SOC) of said battery and said estimated temperature; and reducing said nominal optimum charging voltage to a fuel economy minimum charging voltage if said SOC is above a predetermined level and said current is within a predetermined range.

18. The method of claim 17 further comprising:

converting said nominal optimum charging voltage to a % duty cycle; and charging said battery using a generator based on said % duty cycle.

19. The method of claim 18 further comprising:

determining a difference between said current and a predetermined current value; and adjusting said % duty cycle to until said current is equal to said predetermined current value.

20. The method of claim 18 further comprising:

converting said % duty cycle to a pulse-width modulated (PWM) % duty cycle; and operating said generator based on said PWM % duty cycle.

21. The method of claim 17 wherein said predetermined level is 80%.

22. The method of claim 17 wherein said predetermined range is between −8 A and 15 A.

23. The method of claim 17 wherein said reducing step is performed if an outside air temperature is within a first temperature range, a vehicle speed is less than a predetermined speed, and an accessory is off.

24. The method of claim 23 wherein said accessory is headlamps.

25. The method of claim 17 wherein said nominal optimum charging voltage is based on said SOC.

26. The method of claim 17 wherein reducing said nominal optimum charging voltage is achieved at a rate of 0.05V/s.

27. The method of claim 17 wherein determining said nominal optimum charging voltage includes:

determining a running SOC of said battery;

interpolating a value of said nominal optimum charging voltage based on said running SOC and said temperature.

28. The method of claim 27 wherein interpolating is based upon a plurality of calibration constants.

29. The method of claim 27 further comprising determining said running SOC as a function of a start-up SOC, an adjusted amp-hours of said battery and a battery capacity.

30. The method of claim 29 wherein said start-up SOC is determined using a look-up table that is accessed based on an estimated temperature of said battery and a last stored open-circuit voltage.

31. The method of claim 29 wherein said start-up SOC is based on a plurality of start-up calibration constants and an estimated temperature of said battery.

32. A method of protecting a battery from sulfation, comprising:

estimating a temperature of a battery;

determining a nominal optimum charging voltage as a function of a state of charge (SOC) of said battery and said estimated temperature;

comparing said nominal optimum charging voltage to a threshold value; and increasing said nominal optimum charging voltage to above said threshold value if below said threshold value for a first predetermined period of time.

33. The method of claim 32 wherein said threshold value is 13.2V.

34. The method of claim 32 wherein said first predetermined period is 30 minutes.

35. The method of claim 32 further comprising holding said nominal optimum charging voltage above said threshold level for at least a second predetermined period of time.

36. The method of claim 35 wherein said second predetermined period of time is 3 minutes.

37. The method of claim 32 wherein said increasing occurs at a rate of 0.05V/s.

* * * * *